United States Patent
Kim et al.

(10) Patent No.: US 12,297,379 B2
(45) Date of Patent: May 13, 2025

(54) ADHESIVE COMPOSITION, METHOD FOR PREPARING THE SAME, RETICLE ASSEMBLY INCLUDING THE SAME, AND METHOD FOR FABRICATING RETICLE ASSEMBLY INCLUDING THE SAME

(71) Applicant: Samsung Electronics Co., Ltd., Suwon-si (KR)

(72) Inventors: Mun Ja Kim, Hwaseong-si (KR); Byungchul Yoo, Yongin-si (KR); Haeshin Lee, Daejeon (KR); Chang Young Jeong, Yongin-si (KR); Yunhan Lee, Daejeon (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 18/404,861

(22) Filed: Jan. 4, 2024

(65) Prior Publication Data
US 2024/0174902 A1    May 30, 2024

Related U.S. Application Data

(62) Division of application No. 17/516,428, filed on Nov. 1, 2021, now Pat. No. 12,018,183.

(30) Foreign Application Priority Data

Nov. 2, 2020    (KR) .................. 10-2020-0144447

(51) Int. Cl.
    C09J 129/04    (2006.01)
    C08K 3/04      (2006.01)
    C08K 3/36      (2006.01)
    C08K 5/05      (2006.01)
    G03F 1/64      (2012.01)
    C08H 7/00      (2011.01)

(52) U.S. Cl.
    CPC ............. *C09J 129/04* (2013.01); *C08K 3/042* (2017.05); *C08K 3/36* (2013.01); *C08K 5/05* (2013.01); *G03F 1/64* (2013.01); *C08H 6/00* (2013.01)

(58) Field of Classification Search
    CPC ........ C09J 129/04; C08K 5/1545; C08K 5/13; C08K 3/34; C08K 3/042; C08K 3/36
    See application file for complete search history.

(56) References Cited

U.S. PATENT DOCUMENTS

| | | |
|---|---|---|
| 7,759,442 B2 | 7/2010 | Okada et al. |
| 8,404,405 B2 | 3/2013 | Kim et al. |
| 8,507,158 B2 | 8/2013 | Murakami et al. |

(Continued)

FOREIGN PATENT DOCUMENTS

| | | |
|---|---|---|
| JP | H09-176602 A | 7/1997 |
| KR | 10-2014-0084628 A | 7/2014 |

(Continued)

*Primary Examiner* — Catherine S Branch
*Assistant Examiner* — Olga Lucia Donahue
(74) *Attorney, Agent, or Firm* — Muir Patent Law, PLLC

(57) ABSTRACT

An adhesive composition, a method for preparing the same, a reticle assembly including the same, and a method for fabricating the reticle assembly including the same are provided. The adhesive composition includes a polyphenol compound including tannic acid, a polymer including polyvinyl alcohol, and a solvent including water and alcohol.

16 Claims, 4 Drawing Sheets

(56) References Cited

U.S. PATENT DOCUMENTS

| | | | |
|---|---|---|---|
| 8,821,901 | B2 | 9/2014 | Feldstein et al. |
| 9,039,861 | B2 | 5/2015 | Yasui et al. |
| 2006/0257754 | A1 | 11/2006 | Harubayashi et al. |
| 2017/0047584 | A1 | 2/2017 | Hwang et al. |
| 2020/0362208 | A1 | 11/2020 | Hwang et al. |

FOREIGN PATENT DOCUMENTS

| | | |
|---|---|---|
| KR | 20170038493 A | 4/2017 |
| KR | 20170045714 A | 4/2017 |
| KR | 20190022359 A | 3/2019 |
| KR | 10-2020-0001097 A | 1/2020 |
| WO | 2018062835 A1 | 4/2018 |

ADHESIVE COMPOSITION, METHOD FOR PREPARING THE SAME, RETICLE ASSEMBLY INCLUDING THE SAME, AND METHOD FOR FABRICATING RETICLE ASSEMBLY INCLUDING THE SAME

CROSS-REFERENCE TO RELATED APPLICATION

This application claims priority from Korean Patent Application No. 10-2020-0144447 filed on Nov. 2, 2020 in the Korean Intellectual Property Office, and all the benefits accruing therefrom under 35 U.S.C. 119, the contents of which in its entirety are herein incorporated by reference.

BACKGROUND

1. Technical Field

The present disclosure relates to an adhesive composition, a method for preparing the same, a reticle assembly including the same, and a method for preparing a reticle assembly including the same. More particularly, the present disclosure relates to a composition for a polyphenol-based adhesive, a method for preparing the same, a reticle assembly including the same, and a method for fabricating a reticle assembly including the same.

2. Description of the Related Art

Photolithography may be used to fabricate an electronic device such as a semiconductor device, and a reticle assembly and a pellicle for protecting the reticle assembly may be used to perform the photolithography.

The pellicle may include a pellicle membrane and a frame supporting the pellicle membrane. Meanwhile, the pellicle membrane and the frame, or the frame and the reticle assembly may be bonded to each other by an adhesive. This adhesive requires strong adhesive strength and should be capable of being easily removed for pellicle replacement.

SUMMARY

Aspects of the present disclosure provide an adhesive composition that is easily removed, is environmentally friendly and has strong adhesive strength, and a method for preparing the same.

Aspects of the present disclosure also provide a reticle assembly using an adhesive composition that can be easily removed, is environmentally friendly and has strong adhesive strength, and a method for fabricating the same.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present inventive concept, there is provided an adhesive composition comprising a polyphenol compound including tannic acid, a polymer including polyvinyl alcohol, and a solvent including water and alcohol.

According to an aspect of the present inventive concept, there is provided an adhesive composition in a powder form, comprising a polyphenol compound including tannic acid, and a polymer including polyvinyl alcohol.

According to an aspect of the present inventive concept, there is provided a method for preparing an adhesive composition, comprising providing an aqueous polyphenol solution including tannic acid, providing an aqueous polymer solution including polyvinyl alcohol, mixing the aqueous polyphenol solution with the aqueous polymer solution to form a mixed aqueous solution, drying the mixed aqueous solution to form a powder composition, and dissolving the powder composition in a solvent including water and alcohol.

According to an aspect of the present inventive concept, there is provided a reticle assembly comprising a photomask, a stud protruding from the photomask, a pellicle adhesive layer configured to adhere the stud onto the photomask, and a pellicle fixed on the photomask by the stud, wherein the pellicle adhesive layer includes a polyphenol compound including tannic acid and a polymer including polyvinyl alcohol.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
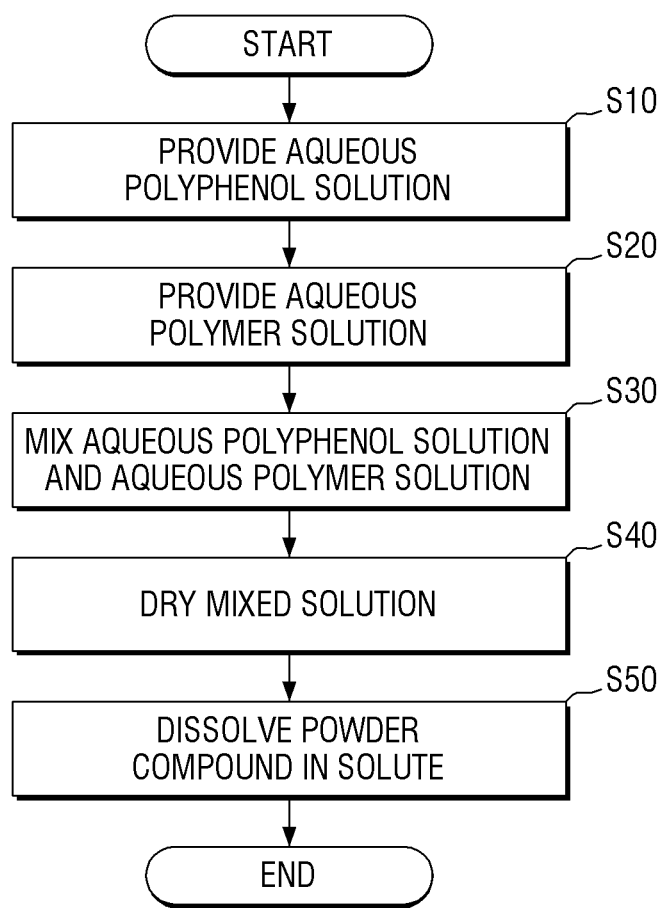
FIG. 1 is a flowchart illustrating a method for preparing an adhesive composition according to some embodiments.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present Like numbers refer to like elements throughout. As used herein, the term "and/or" includes any and all combinations of one or more of the associated listed items.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Adhesive Composition

Hereinafter, an adhesive composition according to exemplary embodiments will be described.

The adhesive composition according to some embodiments contains a polyphenol compound, a polymer and the balance of a solvent.

The polyphenol compound may include tannic acid (TA). The polyphenol compound including tannic acid may be naturally obtained. The tannic acid may have a large molecular size and may include a plurality of hydroxy groups. The tannic acid may be represented by Formula 1 below.

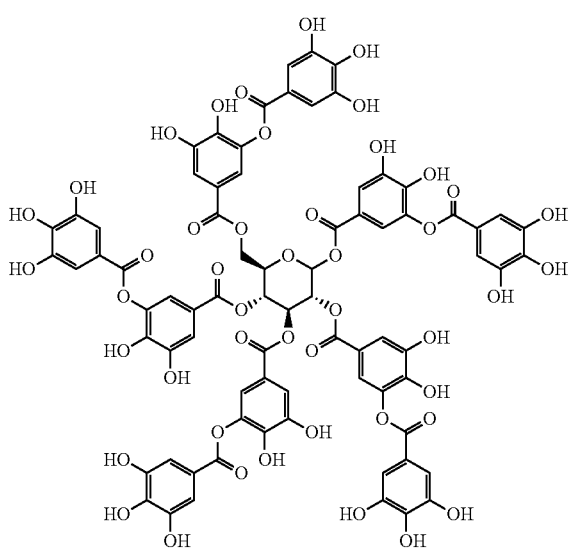

[Formula 1]

In some embodiments, the content of tannic acid may be about 5 wt % (% by weight) to about 45 wt % with respect to 100 wt % of the adhesive composition. Preferably, the content of tannic acid may be from about 10 wt % to about 40 wt % with respect to 100 wt % of the adhesive composition. When the content of tannic acid is excessively low, sufficient adhesive strength cannot be provided. When the content of tannic acid is excessively high, the viscosity of the adhesive composition may increase excessively.

The polymer may include polyvinyl alcohol (PVA). The polyvinyl alcohol may include a plurality of hydroxy groups. The polyvinyl alcohol may be represented by Formula 2 below. In Formula 2 below, l is a natural number of 2 or more.

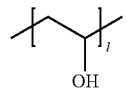

[Formula 2]

The polyvinyl alcohol may be a fully hydrated polyvinyl alcohol, or may be a copolymer including partially repeating units other than vinyl alcohol. For example, the polyvinyl alcohol may include poly(vinyl alcohol-co-vinyl acetate), represented by Formula 3 below. In Formula 3 below, each of m and n is a natural number.

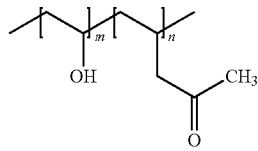

[Formula 3]

In some embodiments, the content of the polyvinyl alcohol may be about 5 wt % to about 45 wt % with respect to 100 wt % of the adhesive composition. Preferably, the content of the polyvinyl alcohol may be about 10 wt % to about 40 wt % with respect to 100 wt % of the adhesive composition. When the content of the polyvinyl alcohol is excessively low, sufficient adhesive strength cannot be provided. When the content of the polyvinyl alcohol is excessively high, the viscosity of the adhesive composition may increase excessively.

In some embodiments, the polyvinyl alcohol may have a weight average molecular weight of about 8,000 to about 70,000. For example, the weight average molecular weight of the polyvinyl alcohol may be about 9,000 to about 10,000. When the weight average molecular weight of the polyvinyl alcohol is excessively low, sufficient adhesive strength cannot be provided. When the weight average molecular weight of the polyvinyl alcohol is excessively high, the viscosity of the adhesive composition may increase excessively.

In some embodiments, the ratio of the weight of the polyvinyl alcohol to the weight of the tannic acid may be about 0.1 to about 10. Preferably, the ratio of the weight of the polyvinyl alcohol to the weight of the tannic acid may be about 0.5 to about 2.

The solvent may include water and alcohol. For example, the solvent may be provided by adding alcohol as a co-solvent to water. The alcohol may be, for example, ethanol, but is not limited thereto.

A polyphenol-based adhesive that uses only water as a solvent has a problem in that a continuous phase separation phenomenon, such as precipitation in a gel type, occurs. In addition, an organic solvent such as alcohol used alone as a solvent has a problem of being incapable of easily dissolving a polyphenol compound and/or polymer. However, the adhesive composition according to some embodiments is capable of preventing a phase separation phenomenon and homogeneously dissolving the polyphenol compound and the polymer due to the use of the solvent including the alcohol as a co-solvent. Accordingly, an adhesive composition that is provided in a liquid state, prevents a phase separation phenomenon and thus has increased pot life and improved storage properties, may be provided.

In some embodiments, the ratio of the weight of the alcohol to the weight of the water may be about 0.1 to about 10. Preferably, the ratio of the weight of the alcohol to the weight of the water may be about 0.5 to about 2.

The adhesive composition according to some embodiments may be represented by Formula 4 below. In Formula 4 below, the alcohol is ethanol.

composition according to some embodiments may form a relatively small number of hydrogen bonds compared to an adhesive composition using only water as a solvent. For example, as shown in Formula 4 above, each water molecule or each alcohol molecule of the adhesive composition according to some embodiments may form one to two hydrogen bonds with the tannic acid or the polyvinyl alcohol. In contrast, each water molecule of the adhesive composition using only water as a solvent may form three or more hydrogen bonds with the tannic acid or the polyvinyl alcohol. As a result, an adhesive composition that has controlled viscosity and thus improved usability in the bonding process may be provided.

The adhesive composition according to some embodiments may further contain silicon oxide. The silicon oxide may, for example, include silica particles. For example, the

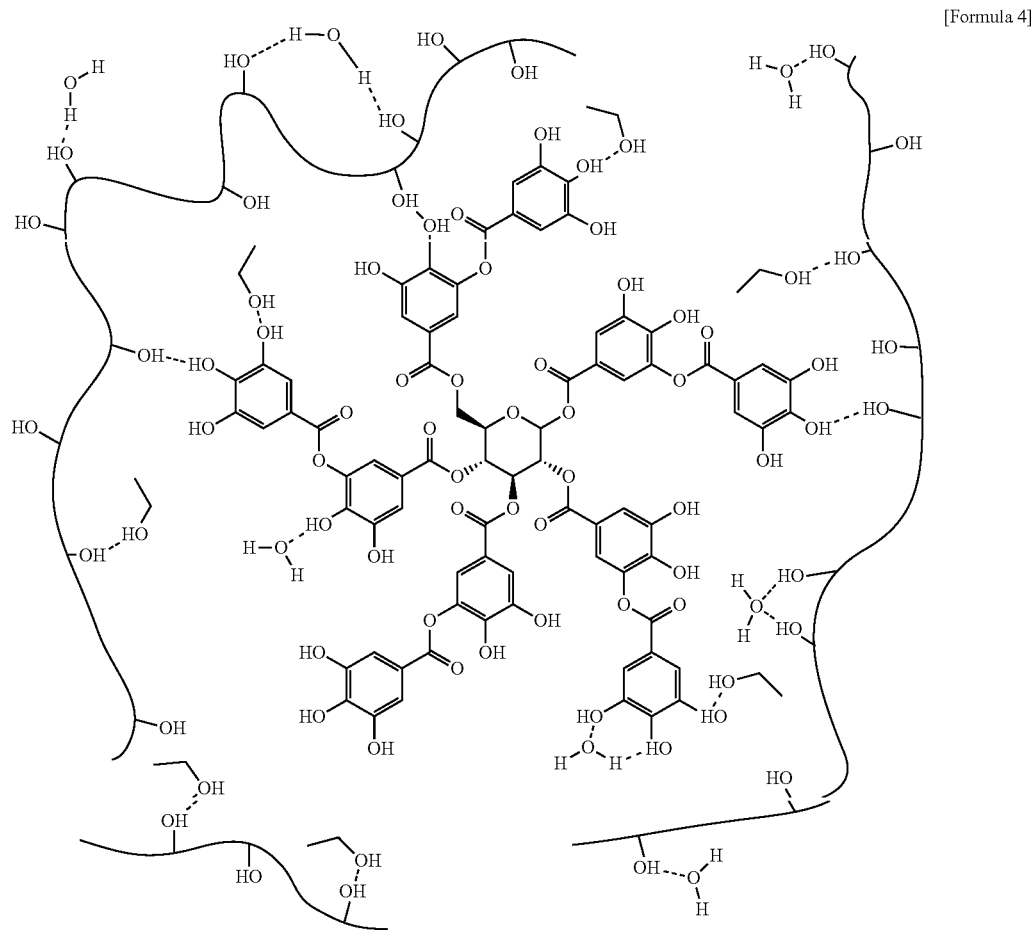

[Formula 4]

As shown in Formula 4 above, each of the tannic acid and the polyvinyl alcohol may include a plurality of hydroxy groups, so the polyvinyl alcohol may form hydrogen bonds with the tannic acid and be entangled therewith. As a result, the adhesive composition containing the tannic acid and the polyvinyl alcohol may have an adhesive strength.

In addition, as shown in Formula 4 above, the solvent including water and alcohol may form hydrogen bonds with the tannic acid and the polyvinyl alcohol. Because the solvent includes the alcohol as a co-solvent, it may form a relatively small number of hydrogen bonds with the tannic acid and the polyvinyl alcohol. For example, the adhesive silicon oxide may include a silica nano-powder. The silica particles may, for example, have a size of about 1 nm to about 100 μm, but are not limited thereto. The silica particles may, for example, have a solid structure, a porous structure, a hollow structure, an aerogel structure, or the like, but are not limited thereto.

The silicon oxide is capable of controlling the drying (or curing) rate of the adhesive composition according to some embodiments. For example, the silicon oxide may supply oxygen to a coating layer formed using the adhesive composition according to some embodiments. Accordingly, the silicon oxide is capable of improving the drying (or curing)

rate of the adhesive composition according to some embodiments and improving adhesive strength by inducing a homogeneous reaction between the surface and the inside of the coating layer.

In some embodiments, the content of the silicon oxide may be about 0.01 wt % to about 20 wt % with respect to 100 wt % of the adhesive composition. Preferably, the content of the silicon oxide may be about 1 wt % to about 10 wt % with respect to 100 wt % of the adhesive composition. When the content of the silicon oxide is excessively low, the curing rate may decrease and curing may be heterogeneous. When the content of the silicon oxide is excessively high, sufficient adhesive strength cannot be provided.

The adhesive composition according to some embodiments may further contain graphene oxide (GO). The graphene oxide may, for example, include a graphene oxide nano-powder.

The graphene oxide is capable of controlling the drying (or curing) rate of the adhesive composition according to some embodiments. For example, the graphene oxide may supply oxygen to a coating layer formed using the adhesive composition according to some embodiments. Accordingly, the graphene oxide is capable of improving the drying (or curing) rate of the adhesive composition according to some embodiments and improving adhesive strength by inducing a homogeneous reaction between the surface and the inside of the coating layer.

In some embodiments, the content of the graphene oxide may be about 0.01 wt % to about 20 wt % with respect to 100 wt % of the adhesive composition. Preferably, the content of the graphene oxide may be about 1 wt % to about 10 wt % with respect to 100 wt % of the adhesive composition. When the content of the graphene oxide is excessively low, the curing rate may decrease and curing may be heterogeneous. When the content of the graphene oxide is excessively high, sufficient adhesive strength cannot be provided.

The adhesive composition according to some embodiments may be provided in a powder form. For example, the adhesive composition according to some embodiments may not contain the solvent. The adhesive composition provided in the form of a powder has excellent storage and transport properties, and thus may improve the productivity of products using the adhesive composition.

In some embodiments, the adhesive composition provided in a powder form may be obtained through lyophilization (freeze-drying). In this regard, a method for preparing the adhesive composition will be described in more detail later.

As described above, the adhesive composition according to some embodiments has excellent adhesive strength and is easily removed by water because it is a water-soluble adhesive which is cured by a hydrogen bond, and is environmentally friendly due to the absence of harmful substances therein and reduced outgassing. For example, the adhesive composition according to some embodiments has advantages of reduced outgassing and increased environmental friendliness compared to an epoxy-based adhesive that is not easily removed or contains a harmful substance (e.g., styrene or bisphenol A). In addition, for example, the adhesive composition according to some embodiments has an advantage of having strong adhesive strength compared to a cyano acrylate-based adhesive having weak adhesive strength.

Method for Preparing Adhesive Composition

Hereinafter, a method for preparing an adhesive composition according to exemplary embodiments will be described with reference to FIG. 1.

FIG. 1 is a flowchart illustrating a method for preparing an adhesive composition according to some embodiments.

Referring to FIG. 1, a method for preparing an adhesive composition according to some embodiments may include providing an aqueous polyphenol solution (step S10), providing an aqueous polymer solution (step S20), mixing the aqueous polyphenol solution with the aqueous polymer solution to form a mixed aqueous solution (step S30), drying the mixed aqueous solution to form a powder composition (step S40), and dissolving the powder composition in a solvent (step S50).

The aqueous polyphenol solution may contain the tannic acid. In some embodiments, the aqueous polyphenol solution may contain about 5% to about 80 wt % of the tannic acid and the balance of water. Preferably, the aqueous polyphenol solution may contain about 10% to about 40 wt % of the tannic acid and the balance of water.

The aqueous polymer solution may contain the polyvinyl alcohol. In some embodiments, the aqueous polymer solution may contain about 5% to about 80 wt % of the polyvinyl alcohol and the balance of water. Preferably, the aqueous polymer solution may contain about 10% to about 40 wt % of the polyvinyl alcohol and the balance of water.

In some embodiments, the ratio of the weight of the polyvinyl alcohol to the weight of the tannic acid may be about 0.1 to about 10. Preferably, the ratio of the weight of the polyvinyl alcohol to the weight of the tannic acid may be about 0.5 to about 2.

Subsequently, the aqueous polyphenol solution may be mixed with the aqueous polymer solution (step S30). As a result, a mixed aqueous solution containing the tannic acid and the polyvinyl alcohol may be formed.

In some embodiments, the mixed aqueous solution may further contain the silicon oxide and/or the graphene oxide.

Subsequently, the mixed aqueous solution may be dried (step S40). When the mixed aqueous solution is dried, a powder composition provided in a powder form may be formed. The powder composition may not contain a solvent (water). For example, the powder composition may contain about 50 wt % of the tannic acid and about 50 wt % of the polyvinyl alcohol.

In some embodiments, forming the powder composition (S40) may include lyophilizing (or freeze-drying) the mixed aqueous solution. For example, the mixed aqueous solution may be frozen, the pressure may be reduced to sublimate the water from a solid to a gas and the sublimated water may be removed to dry the mixed aqueous solution. Subsequently, the dried mixed aqueous solution may be ground to provide the powder composition. Accordingly, the adhesive composition according to some embodiments may be provided in a powder form.

Subsequently, the powder composition may be dissolved in a solvent (step S50). The solvent may include water and alcohol. For example, the solvent may be provided by adding alcohol as a co-solvent to water. The alcohol may, for example, be ethanol, but is not limited thereto. Accordingly, the adhesive composition according to some embodiments may be provided in the form of a liquid mixture.

In some embodiments, the ratio of the weight of the alcohol to the weight of the water may be about 0.1 to about 10. Preferably, the ratio of the weight of the alcohol to the weight of the water may be about 0.5 to about 2.

The adhesive composition according to some embodiments may contain about 5% to about 45 wt % of the tannic acid, about 5% to about 45 wt % of the polyvinyl alcohol, and the balance of the solvent. Preferably, the adhesive composition according to some embodiments may contain about 10% to about 40 wt % of the tannic acid, about 10% to about 40 wt % of the polyvinyl alcohol, and the balance of the solvent.

Hereinafter, the effects of the adhesive composition according to exemplary embodiments will be described in more detail with reference to FIGS. 2 to 5, Preparation Examples and Comparative Examples.

Preparation Example 1

Tannic acid (TA) was added to double distilled water (DDW), followed by stirring for 4 hours using a shaker to prepare an aqueous polyphenol solution containing 20 wt % of tannic acid.

In addition, polyvinyl alcohol (PVA) was added to double distilled water (DDW), followed by stirring at 70° C. for 24 hours using a shaker to provide an aqueous polymer solution containing 20 wt % of polyvinyl alcohol (PVA).

Subsequently, the aqueous polyphenol solution was mixed with the aqueous polymer solution at a ratio of 1:1, followed by vigorously stirring for several minutes to prepare 50 mL of an opaque brown tannic-acid/polyvinyl-alcohol complex.

Subsequently, the tannic-acid/polyvinyl-alcohol complex was immersed in liquid nitrogen (about −196° C.), frozen and lyophilized to remove moisture, and the residue was ground using a grinder (or mortar) to prepare a composition as a powder.

Subsequently, the powder composition was added to a solvent of water and ethanol, which were mixed in a ratio of 1:1, followed by stirring, to prepare an adhesive composition containing 20 wt % of the powder composition.

Comparative Example 1

A gel-type adhesive composition was prepared by centrifuging the opaque precipitate of the tannic-acid/polyvinyl-alcohol complex prepared in Preparation Example 1.

Comparative Example 2

DP-460-EG produced by 3M Corp. was used as an epoxy-based adhesive.

[Physical Property Evaluation 1]

The pot life, elastic modulus (E-modulus), lap shear strength, and tensile strength of each of Preparation Example 1, Comparative Example 1 and Comparative Example 2 were measured, and the results are shown in Table 1 below.

TABLE 1

| | Preparation Example 1 | Comparative Example 1 | Comparative Example 2 |
|---|---|---|---|
| Pot life | >1 day | <1 day | <30 min |
| E-modulus (GPa) | 0.35 | — | 1.8~2.6 |
| Lap shear strength (MPa) | 7.5~11.1 | >1 | >10 |
| Tensile strength (MPa) | 2.9~4.7 | 0.067 | <5 |

As can be seen from Table 1 above, the adhesive composition prepared according to Preparation Example 1 exhibits a prolonged pot life compared to Comparative Example 1 and Comparative Example 2. The pot life of Preparation Example 1 can be greater than a day, or even greater than 3 days, or even 1 week or more, while remaining homogenously dissolved and without undergoing phase separation. In particular, the adhesive composition prepared according to Comparative Example 1 exhibited a continuous phase separation phenomenon, such as formation of an aqueous layer as an upper layer, over time. Accordingly, it can be seen that the adhesive composition according to some embodiments has prolonged pot life due to the use of the solvent including the alcohol as a co-solvent.

In addition, as can be seen from Table 1 above, the adhesive composition prepared according to Preparation Example 1 exhibits lap shear strength and tensile strength similar to that of Comparative Example 2. As can be seen in Table 1, both Preparation Example 1 and Comparative Example 2 (epoxy based adhesive) can have a lap shear strength of greater than 10 MPa and also have a tensile strength of less than 5 MPa. Accordingly, it can be seen that the adhesive composition according to some embodiments has high adhesive strength comparable to that of an epoxy-based adhesive.

Preparation Example 2

An adhesive composition was prepared in a manner similar to that of Preparation Example 1, except that the powder composition was added in an amount of 40 wt % (with respect to 100 wt % of the adhesive composition) in Preparation Example 1.

Preparation Example 3

An adhesive composition was prepared in a manner similar to that of Preparation Example 2, except that silicon oxide particles (silica particles) were further added in an amount of 1 wt % (with respect to 100 wt % of the adhesive composition) in Preparation Example 2.

Preparation Example 4

An adhesive composition was prepared in a manner similar to that of Preparation Example 2, except that silicon oxide particles (silica particles) were further added in an amount of 5 wt % (with respect to 100 wt % of the adhesive composition) in Preparation Example 2.

Preparation Example 5

An adhesive composition was prepared in a manner similar to that of Preparation Example 2, except that silicon oxide particles (silica particles) were further added in an amount of 10 wt % (with respect to 100 wt % of the adhesive composition) in Preparation Example 2.

Preparation Example 6

An adhesive composition was prepared in a manner similar to that of Preparation Example 2, except that graphene oxide (GO) was further added in an amount of 1 wt % (with respect to 100 wt % of the adhesive composition) in Preparation Example 2.

Preparation Example 7

An adhesive composition was prepared in a manner similar to that of Preparation Example 2, except that graphene oxide (GO) was further added in an amount of 5 wt % (with respect to 100 wt % of the adhesive composition) in Preparation Example 2.

Preparation Example 8

An adhesive composition was prepared in a manner similar to that of Preparation Example 2, except that graphene oxide (GO) was further added in an amount of 10 wt % (with respect to 100 wt % of the adhesive composition) in Preparation Example 2.

[Physical Property Evaluation 2]

The dynamic modulus, storage modulus (G') and loss modulus (G") of Preparation Examples 2 to 8, and Comparative Examples 1 and 2 were measured at 1 Hz, and the results are shown in Table 2 below.

TABLE 2

|  | Storage Modulus (G') | Loss Modulus (G") |
| --- | --- | --- |
| Preparation Example 2 | 147.10 | 236.40 |
| Preparation Example 3 | 20.14 | 36.29 |
| Preparation Example 4 | 202.4 | 391.4 |
| Preparation Example 5 | 39.69 | 77.79 |
| Preparation Example 6 | 40.07 | 55.85 |
| Preparation Example 7 | 66.25 | 118.8 |
| Preparation Example 8 | 34.34 | 16.10 |
| Comparative Example 1 | 133,200.00 | 104,700.00 |
| Comparative Example 2 | 4.156 | 77.29 |

As can be seen from Table 2 above, the adhesive composition prepared according to Preparation Examples 2 to 8 exhibits a remarkably decreased dynamic modulus compared to Comparative Example 1. From Table 2, e.g. in preparation examples 3 and 5-8, the storage modulus is in a range of from 20 to 70 MPa, and the loss modulus is from 15 to 120 MPa, or e.g. in examples 3, 5, 6 and 8, the storage modulus can be in the range of from about 20 to about 40 MPa, and the loss modulus can be in the range of from 15 to 80 MPa.

Accordingly, it can be seen that the adhesive compositions according to some embodiments have controlled viscosity and thus increased usability in the adhesion process due to the use of the solvent including the alcohol as a co-solvent.

In addition, as can be seen from Table 2, each of the adhesive compositions prepared according to Preparation Examples 2 to 8 exhibits a dynamic modulus similar to that of Comparative Example 2. Accordingly, it can be seen that the adhesive compositions according to some embodiments have strong adhesive strength comparable to that of an epoxy-based adhesive.

In addition, as can be seen from Table 2 above, the adhesive compositions prepared according to Preparation Examples 3 to 8 exhibit an increased dynamic modulus compared to Preparation Example 2. Accordingly, it can be seen that the adhesive compositions according to some embodiments have increased adhesive strength because they further contain the silicon oxide or the graphene oxide.

Reticle Assembly

Hereinafter, a reticle assembly including an adhesive composition according to exemplary embodiments will be described with reference to FIGS. 2 to 4.

Figure 2:
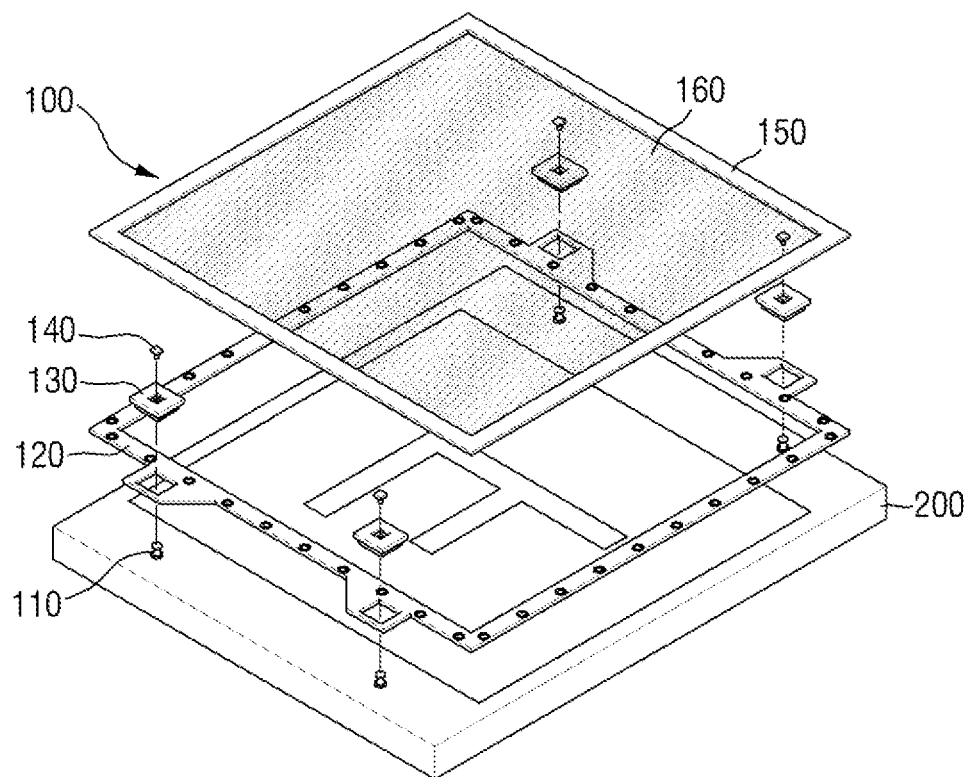
FIG. 2 is a perspective view illustrating a reticle assembly including an adhesive composition according to some embodiments.

FIG. 2 is a perspective view illustrating a reticle assembly including an adhesive composition according to some embodiments. FIG. 3 is a schematic cross-sectional view illustrating the reticle assembly of FIG. 2. For simplicity of description, redundant parts of the description already given above may be recapitulated or omitted.

Figure 3:
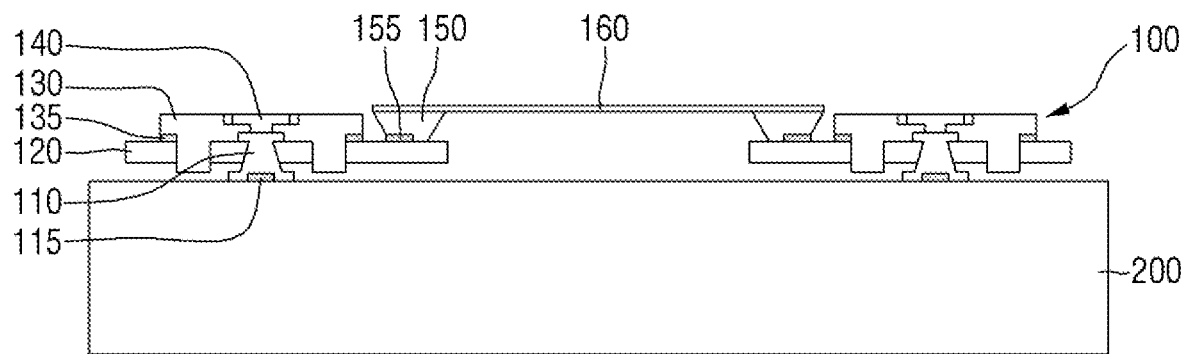
FIG. 3 is a schematic cross-sectional view illustrating the reticle assembly of FIG. 2.

Referring to FIGS. 2 and 3, the reticle assembly according to some embodiments may include a pellicle 100, a pellicle adhesive layer 115, and a photomask 200.

The photomask 200 may include a pattern (e.g., "F" shape in FIG. 2) for performing a photolithography process.

The pellicle 100 may be disposed on the photomask 200. The pellicle 100 may protect the photomask 200 from contamination by foreign matter such as dust. In addition, the pellicle 100 may have a light transmittance to transmit light incident on and reflected from the photomask 200. For example, the pellicle 100 may include a frame 120 and a pellicle membrane 160.

The pellicle membrane 160 may be provided in the form of a layer spaced apart from the photomask 200. The pellicle membrane 160 may have a light transmittance. For example, the pellicle membrane 160 may have a transmittance to extreme ultraviolet (EUV) light of about 80% or more, and preferably about 90%. The pellicle membrane 160 may include any of various materials having high transmittance to light (e.g., extreme ultraviolet light).

In some embodiments, the pellicle membrane 160 may be spaced from the photomask 200 by a distance of about 1 mm to about 10 mm Although the frame 120 is illustrated to have a rectangular shape in plan view, this is provided only as an example, and the frame 120 may have any of various shapes, such as a circular shape.

In some embodiments, the pellicle membrane 160 may include silicon. For example, the pellicle membrane 160 may include polycrystalline silicon, single crystal silicon, silicon nitride, or a combination thereof.

In some embodiments, the pellicle membrane 160 may include a carbon-based material. For example, the pellicle membrane 160 may include amorphous carbon, graphene, nanometer-thickness graphite, carbon nanosheet, carbon nanotubes, silicon carbide (SiC), boron carbide ($B_4C$), or a combination thereof. For example, the pellicle membrane 160 may include nanocrystalline graphene. The nanocrystalline graphene may include a plurality of nano-scale crystal grains, and the crystal grains may include a two-dimensional carbon structure having an aromatic ring structure. The size (length or diameter) of the crystal grains may be several hundred nanometers (nm) or less, for example, about 100 nm or less. The two-dimensional carbon structure may have a layered structure in which carbon atoms are arranged in two dimensions. The crystal grains of the nanocrystalline graphene may include a defect. For example, the defect may include at least one of a $sp^3$ a carbon (C) atom, a hydrogen (H) atom, an oxygen (O) atom, a nitrogen (N) atom, or carbon vacancy.

In some embodiments, the pellicle membrane 160 may include a semiconductor material having a two-dimensional crystal structure. For example, the pellicle membrane 160 may include transition metal dichalcogenide (TMD). For example, the transition metal dichalcogenide may contain one metal element selected from Mo, W, Nb, V, Ta, Ti, Zr, Hf, Tc, Re, Cu, Ga, In, Sn, Ge and Pb, and one chalcogen element selected from S, Se and Te.

In some embodiments, the pellicle membrane 160 may include a fluorine-based polymer.

In some embodiments, the pellicle membrane 160 may have a monolayer structure or a multilayer structure. For example, the pellicle membrane 160 may have a multilayer structure including a combination of the materials described above. In addition, the pellicle membrane 160 may further include a protective layer that is bonded to one side or both sides of the membrane layer and includes SiC, SiO$_2$, Si$_3$N$_4$, SiON, Y$_2$O$_3$, YN, Mo, Ru, Rh, BN, B$_4$C, B, or a combination thereof.

In some embodiments, the pellicle membrane 160 may have a thickness of about 200 nm or less. For example, the thickness of the pellicle membrane 160 may be about 1 nm to about 100 nm.

The frame 120 may be disposed along the edge of the photomask 200. Accordingly, the frame 120 may expose the pattern of the photomask 200 (for example, "F" shape in FIG. 2).

The frame 120 may support the pellicle membrane 160 such that the pellicle membrane 160 is spaced apart from the photomask 200 by a predetermined distance. For example, a membrane boundary 150 may be formed along the edge of the pellicle membrane 160. The membrane boundary 150 may be adhered onto the frame 120 by a membrane adhesive layer 155. As a result, the pellicle membrane 160 may be fixed on the frame 120.

In some embodiments, the membrane adhesive layer 155 may be formed using the adhesive composition described above. For example, the membrane adhesive layer 155 may include the polyphenol compound including tannic acid and the polymer including polyvinyl alcohol.

The frame 120 may include any of various materials capable of supporting the pellicle membrane 160. For example, the frame 120 may include a metal having excellent heat dissipation and strength, but is not limited thereto. For example, the frame 120 may include aluminum (Al), anodic aluminum oxide, stainless use steel (SUS), diamond-like carbon (DLC)-treated aluminum, DLC-treated SUS, silicon or a combination thereof.

The frame 120 may be fixed on the photomask 200. In some embodiments, the frame 120 may be fixed on the photomask 200 by a stud 110, a first fixture 130 and a second fixture 140. For example, the stud 110 may be disposed such that the stud 110 protrudes from the upper surface of the photomask 200. In addition, the first fixture 130 and the second fixture 140 may be disposed such that the first fixture 130 and the second fixture 140 are fastened to the frame 120. The first fixture 130 may pass through the frame 120 so as to be fastened to the stud 110. The second fixture 140 may be disposed on the stud 110 so as to fix the stud 110 fastened to the first fixture 130. As a result, the pellicle 100 may be fixed on the photomask 200.

In some embodiments, the stud 110 may be adhered onto the photomask 200 by the pellicle adhesive layer 115. As a result, the pellicle 100 may be fixed on the photomask 200.

In some embodiments, the pellicle adhesive layer 115 may be formed using the adhesive composition described above. For example, the pellicle adhesive layer 115 may include the polyphenol compound including tannic acid and the polymer containing polyvinyl alcohol.

In some embodiments, the first fixture 130 may be adhered onto the frame 120 by a fixture adhesive layer 135. As a result, the first fixture 130 may be fixed on the frame 120.

In some embodiments, the fixture adhesive layer 135 may be formed using the adhesive composition described above. For example, the fixture adhesive layer 135 may include the polyphenol compound including tannic acid and the polymer including polyvinyl alcohol.

Figure 4:
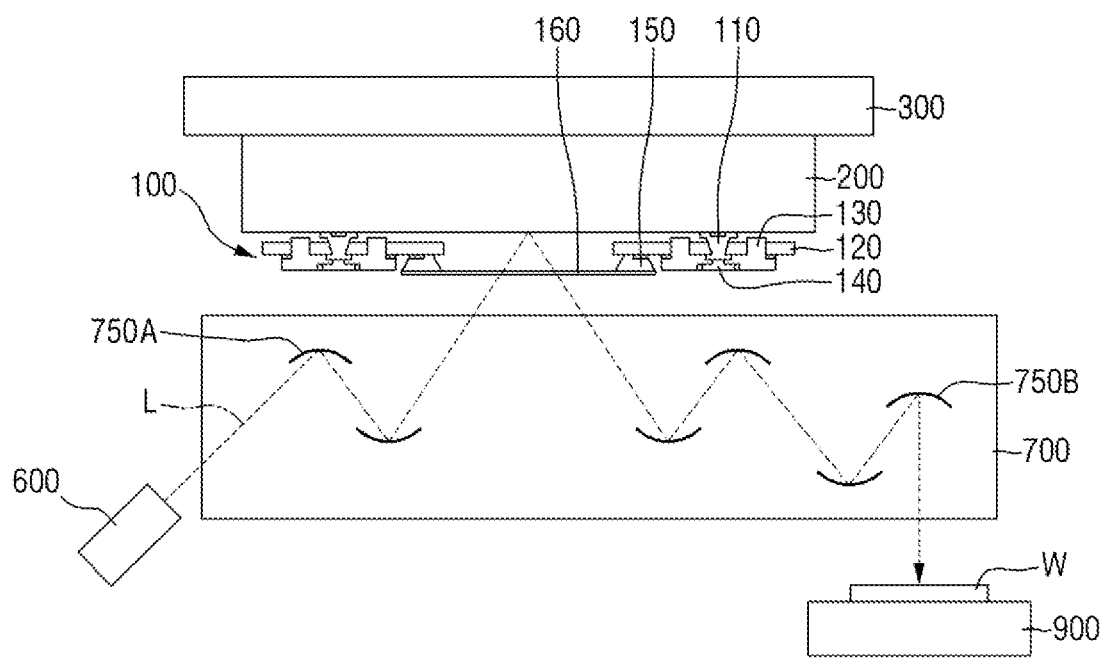
FIG. 4 is a conceptual diagram illustrating exposure equipment using the reticle assembly of FIGS. 2 and 3.

FIG. 4 is a conceptual diagram illustrating exposure equipment using the reticle assembly of FIGS. 2 and 3. For simplicity of description, redundant parts of the description already given above may be recapitulated or omitted.

Referring to FIG. 4, the exposure equipment using the reticle assembly according to some embodiments may include a reticle stage 300, a light irradiator 600, a minor system 700, and a wafer stage 900.

In some embodiments, the exposure equipment may perform a reflective photolithography process using the reticle assembly including the photomask 200 and the pellicle 100.

The reticle assembly according to some embodiments may be mounted on the reticle stage 300. The reticle stage 300 may be movable, for example, in a horizontal direction to carry the reticle assembly according to some embodiments. The reticle assembly may be mounted on the reticle stage 300 such that the pattern of the photomask 200 (e.g., "F" shape in FIG. 2) faces the minor system 700, which will be described later.

The light irradiator 600 may generate light L. The light irradiator 600 may include a light source, a light collector and the like, but is not limited thereto. In some embodiments, the light L generated from the light irradiator 600 may include extreme ultraviolet (EUV) light. For example, the light irradiator 600 may generate light (e.g., extreme ultraviolet light) having a wavelength of about 13.5 nm using carbon plasma. The light L generated by the light irradiator 600 may be supplied to the mirror system 700.

The mirror system 700 may include a plurality of contrast mirrors 750A and a plurality of projection mirrors 750B. The contrast mirrors 750A and the projection minors 750B may collect light L, for example, to prevent the reflected light L from being lost outside of an irradiation path. For example, the contrast mirrors 750A may be concave minors.

The contrast minors 750A may supply the light L from the light irradiator 600 to the reticle stage 300. The light L supplied from the minor system 700 by the contrast minors 750A may pass through the pellicle membrane 160 and may be irradiated on the photomask 200. The light L reflected from the photomask 200 may be supplied to the projection minors 750B. Accordingly, the light incident on the pattern of the photomask 200 (for example, "F" shape in FIG. 2) may be supplied to the projection minors 750B. The projection mirrors 750B may receive light L reflected from the photomask 200 and irradiate the light L to a wafer W.

The wafer W may be loaded on the wafer stage 900. The wafer stage 900 may be movable in, for example, a horizontal direction to carry the wafer W.

In some embodiments, a photoresist layer having a predetermined thickness may be formed on the wafer W. Light L supplied from the minor system 700 may be projected onto the photoresist layer. For example, the focus of the light L supplied from the mirror system 700 may be located within the photoresist layer. Accordingly, the photoresist layer may be partially exposed based on optical pattern information (e.g., "F" shape in FIG. 2) of the photomask 200 to form a photoresist pattern. In addition, a layer formed on the wafer may be partially etched based on the photoresist pattern to form a pattern on the wafer W.

Method for Fabricating Reticle Assembly

Hereinafter, a method for fabricating a reticle assembly including an adhesive composition according to exemplary embodiments will be described with reference to FIGS. 2 to 11.

Figure 5:
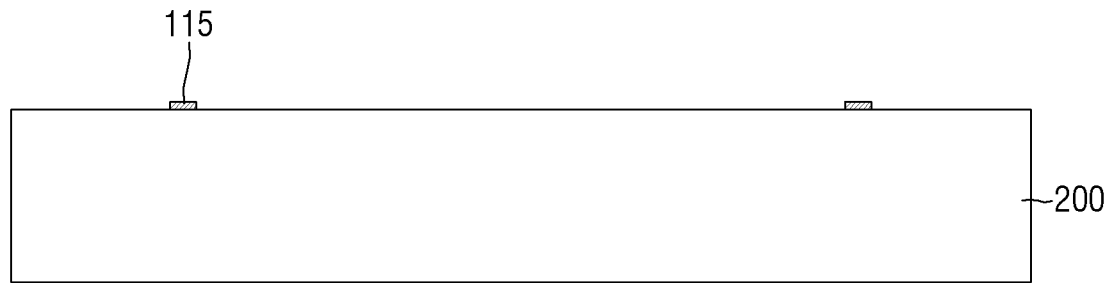
FIGS. 5 to 7 are diagrams illustrating the intermediate steps of a method for fabricating a reticle assembly including an adhesive composition according to some embodiments.
Figure 6:
Figure 7:
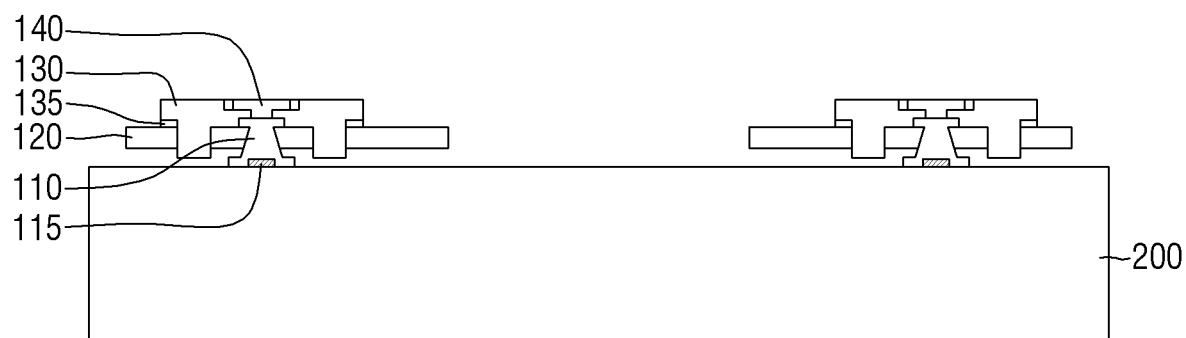

FIGS. 5 to 7 are diagrams illustrating the intermediate steps of a method for fabricating a reticle assembly including an adhesive composition according to some embodiments. For simplicity of description, redundant parts of the description already given above may be recapitulated or omitted.

Referring to FIG. 4, a pellicle adhesive layer 115 is formed on a photomask 200.

The pellicle adhesive layer 115 may be formed using the adhesive composition described above. For example, the adhesive composition may be provided on the upper surface of the photomask 200.

The adhesive composition according to some embodiments may contain the polyphenol compound including tannic acid, the polymer including polyvinyl alcohol, and the solvent including water and alcohol.

Referring to FIG. 6, a stud 110 is adhered onto the photomask 200 using the pellicle adhesive layer 115.

For example, the stud 110 may be disposed on the adhesive composition described above and then pressed. Subsequently, the adhesive composition may be dried in the state in which the adhesive composition contacts the stud 110. As a result, a cured pellicle adhesive layer 115 may be formed on the photomask 200, and the stud 110 may be adhered onto the photomask 200.

In some embodiments, drying the adhesive composition as described above may be carried out at a temperature of about 100° C. or less. For example, drying the adhesive composition may include heating the adhesive composition to a temperature of about 60° C. to about 90° C.

Referring to FIG. 7, a frame 120 is fastened to the stud 110.

For example, the frame 120 may be disposed on the stud 110. Subsequently, a first fixture 130 may be formed such that the first fixture 130 passes through the frame 120 so as to be fastened to the stud 110. Subsequently, a second fixture 140 may be disposed on the stud 110 so as to fix the stud 110 fastened to the first fixture 130.

In some embodiments, the first fixture 130 may be adhered onto the frame 120 by a fixture adhesive layer 135. As a result, the first fixture 130 may be fixed on the frame 120.

In some embodiments, the fixture adhesive layer 135 may be formed using the adhesive composition described above. The adhesive composition according to some embodiments may contain the polyphenol compound including tannic acid, the polymer including polyvinyl alcohol, and the solvent including water and alcohol.

Substantially, referring to FIG. 3, a pellicle membrane 160 is adhered onto the frame 120.

For example, the pellicle membrane 160 may be disposed on the frame 120 such that the pellicle membrane 160 is spaced apart from the photomask 200 by a predetermined distance. A membrane border 150 may be adhered onto the frame 120 by a membrane adhesive layer 155. As a result, the pellicle membrane 160 may be fixed on the frame 120.

In some embodiments, the membrane adhesive layer 155 may be formed using the adhesive composition described above. The adhesive composition according to some embodiments may contain the polyphenol compound including tannic acid, the polymer including polyvinyl alcohol, and the solvent including water and alcohol.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A method for preparing an adhesive composition, comprising:
    providing an aqueous polyphenol solution including tannic acid;
    providing an aqueous polymer solution including polyvinyl alcohol;
    mixing the aqueous polyphenol solution with the aqueous polymer solution to form a mixed aqueous solution;
    drying the mixed aqueous solution to form a powder composition; and
    dissolving the powder composition in a solvent including water and alcohol.

2. The method of claim 1, wherein the forming of the powder composition comprises lyophilizing the mixed aqueous solution.

3. The method of claim 1, wherein the aqueous polyphenol solution contains 10 wt % to 40 wt % of the tannic acid and a balance of water.

4. The method of claim 1, wherein the aqueous polymer solution contains 10 wt % to 40 wt % of the polyvinyl alcohol and a balance of water.

5. The method of claim 1, wherein the alcohol of the solvent comprises ethanol.

6. The method of claim 1, wherein a ratio of a weight of the polyvinyl alcohol to a weight of the tannic acid is 0.5 to 2.

7. The method of claim 6, wherein after dissolving the powder composition in the solvent, adding oxide particles.

8. The method of claim 6, wherein upon dissolving the powder composition in the solvent, an adhesive is formed.

9. A method comprising:
    providing an aqueous polyphenol solution including tannic acid;
    providing an aqueous polymer solution including polyvinyl alcohol;
    mixing the aqueous polyphenol solution with the aqueous polymer solution to form a mixed aqueous solution; and
    drying the mixed aqueous solution to form a powder composition.

10. The method of claim 9, further comprising dissolving the powder composition in a solvent including water and alcohol.

11. The method of claim 10, wherein upon dissolving the powder composition, each water molecule or each alcohol molecule forms one to two hydrogen bonds with the tannic acid or the polyvinyl alcohol.

12. The method of claim 10, wherein after dissolving the powder composition in the solvent, a water soluble adhesive is formed.

13. The method of claim 12, wherein the water soluble adhesive is applied to bond a first surface to a second surface, followed by separating the first and second surfaces by applying water.

14. The method of claim 13, wherein the first and second surfaces are a reticle and a photomask, wherein the photomask has a pattern, wherein light is directed onto the photomask and photoresist so as to transfer the pattern from the photomask to the photoresist, and removing the reticle from the photomask with water.

15. The method of claim 12, wherein a ratio of a weight of the polyvinyl alcohol to a weight of the tannic acid is 0.5 to 2.

16. The method of claim 9, wherein the forming of the powder composition comprises lyophilizing the mixed aqueous solution.

\* \* \* \* \*